US008895868B2

(12) United States Patent
Sunohara (10) Patent No.: US 8,895,868 B2
(45) Date of Patent: Nov. 25, 2014

(54) WIRING SUBSTRATE

(75) Inventor: Masahiro Sunohara, Grenoble (FR)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 127 days.

(21) Appl. No.: 13/153,579

(22) Filed: Jun. 6, 2011

(65) Prior Publication Data

US 2011/0297430 A1 Dec. 8, 2011

(30) Foreign Application Priority Data

Jun. 7, 2010 (JP) .................................. 2010-130421

(51) Int. Cl.
 H05K 1/09 (2006.01)
 H05K 3/10 (2006.01)
 H05K 3/46 (2006.01)
 H05K 3/38 (2006.01)

(52) U.S. Cl.
 CPC ............ *H05K 3/4605* (2013.01); *H05K 3/4661* (2013.01); *H05K 3/388* (2013.01); *H05K 2203/308* (2013.01)
 USPC ............ 174/257; 174/262; 174/264; 361/760

(58) Field of Classification Search
 USPC .................. 174/255, 257, 260–262, 264, 266; 361/760
 See application file for complete search history.

(56) References Cited

U.S. PATENT DOCUMENTS

| 6,319,825 B1* | 11/2001 | Jung et al. ...................... 438/642 |
| 6,617,681 B1* | 9/2003 | Bohr .............................. 257/700 |
| 2007/0045746 A1* | 3/2007 | Sunohara et al. ............. 257/360 |
| 2011/0297426 A1* | 12/2011 | Sunohara et al. ............. 174/251 |

FOREIGN PATENT DOCUMENTS

| JP | 11-220023 | 8/1999 |
| JP | 2004-014848 | 1/2004 |
| JP | 2008-135482 | 6/2008 |
| JP | 2009-238957 | 10/2009 |
| JP | 2009-277895 A1 | 11/2009 |
| JP | 2009-295859 | 12/2009 |

OTHER PUBLICATIONS

Japanese Office Action mailed Jun. 24, 2014, in the corresponding Japanese patent application No. 2010-130421, with English translation.

* cited by examiner

*Primary Examiner* — Anatoly Vortman
*Assistant Examiner* — Jacob Crum
(74) *Attorney, Agent, or Firm* — Kratz, Quintos & Hanson, LLP (57) ABSTRACT

A wiring substrate includes a wiring layer made of copper, an electrode layer made of copper, and an insulating layer arranged adjacent to the electrode layer. The wiring layer is stacked on the electrode layer and the insulating layer. The insulating layer and the wiring layer are stacked with an adhesive layer interposed between the wiring insulating layer and the wiring layer. The electrode layer and the wiring layer are stacked without the adhesive layer interposed between the electrode layer and the wiring layer.

3 Claims, 9 Drawing Sheets

WIRING SUBSTRATE

CROSS-REFERENCE TO RELATED APPLICATION

This application is based upon and claims the benefit of priority of the prior Japanese Patent Application No. 2010-130421, filed on Jun. 7, 2010, the entire contents of which are incorporated herein by reference.

FIELD

The embodiments discussed herein are directed to a wiring substrate and a manufacturing method of the wiring substrate.

BACKGROUND

In recent years, as a wiring substrate for use in a semiconductor device, a substrate having a multi-layer structure has been extensively used. The wiring substrate having the multi-layer structure is, for example, formed by stacking a plurality of wiring layers on a silicon substrate. In the wiring substrate, the wiring layers are stacked with insulating layers interposed between the wiring layers and are electrically connected to one other via electrode layers. An example of such a wiring substrate is a relay substrate called an interposer. The interposer, for example, is installed between a semiconductor element and a packaging substrate to electrically connect the semiconductor element to the packaging substrate.

Figure 8:
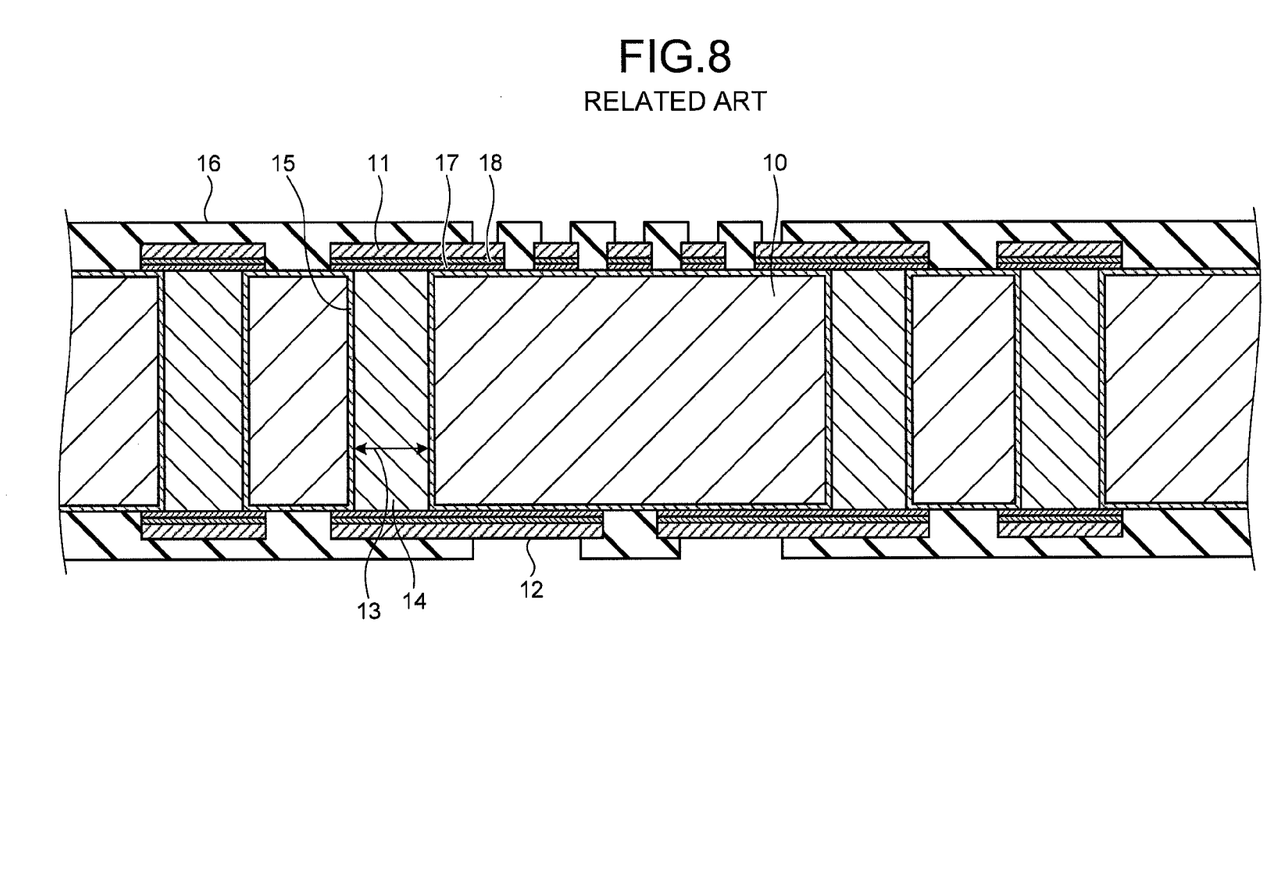
FIG. 8 is a sectional view illustrating the structure of an interposer according to a related art.

FIG. 8 is a sectional view illustrating the structure of an interposer according to a related art. As illustrated in FIG. 8, for example, the interposer is formed using a silicon substrate 10 as a base. The interposer has a wiring pattern 11 on a surface and a wiring pattern 12 on the other surface. The wiring pattern 11 and the wiring pattern 12 are electrically connected to each other via a through electrode 14 formed in a through hole 13 passing through the silicon substrate 10. An oxide layer 15 serving as an insulating layer is formed on the outer surface of the silicon substrate 10 and the inner wall surface of the through hole 13. In addition, the surfaces of the wiring pattern 11 and the wiring pattern 12, for example, are coated with an insulating layer 16 made of polyimide.

In the wiring substrate having the multi-layer structure as described above, there is a situation in which an adhesive layer is formed between a wiring layer and an insulating layer or between a wiring layer and an electrode layer to improve the adhesion property between the layers. For example, in the interposer illustrated in FIG. 8, a titanium (Ti) layer 17 as an adhesive layer is formed between the wiring pattern 11 and the through electrode 14 and between the wiring pattern 11 and the oxide layer 15. Furthermore, a copper layer 18 is formed between the wiring pattern 11 and the titanium layer 17 as an underlayer of the wiring pattern 11. In addition, in the same manner, a titanium layer and a copper layer are also formed between the wiring pattern 12 and the through electrode 14 and between the wiring pattern 12 and the oxide layer 15.

Figure 9A:
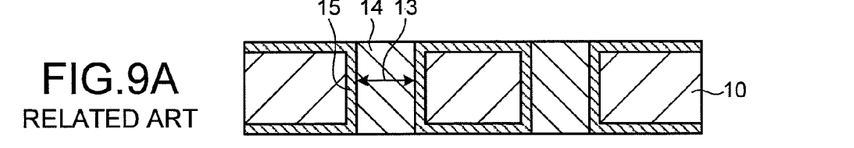
FIGS. 9A to 9F are diagrams illustrating an example of a manufacturing method of an interposer according to a related art.

The interposer, for example, is formed through a manufacturing method described below. FIGS. 9A to 9F are diagrams illustrating an example of a manufacturing method of an interposer according to a related art. FIGS. 9A to 9F illustrate the sections of the interposer in respective steps. First, as illustrated in FIG. 9A, thermal oxidation is performed to form an oxide layer 15 on the outer surface of a silicon substrate 10 and the inner wall surface of a through hole 13 formed in the silicon substrate 10. Then, a through electrode 14 is formed in the through hole 13.

Figure 9B:
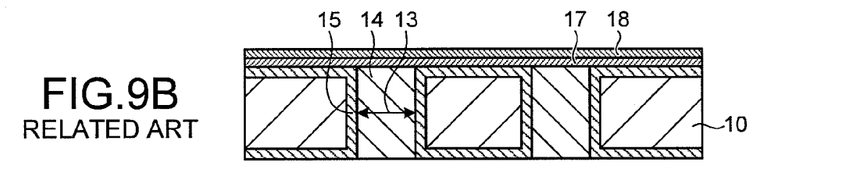
Figure 9C:
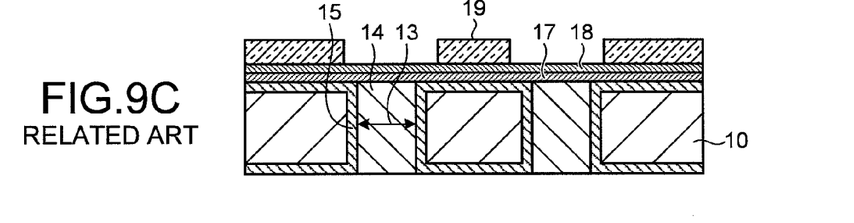

As illustrated in FIG. 9B, a titanium layer 17 is formed on a surface of the silicon substrate 10 through sputtering. The titanium layer 17 serves as an adhesive layer between a wiring pattern 11 and the through electrode 14 and between the wiring pattern 11 and an oxide layer 15. Then, a copper layer 18 is formed on the titanium layer 17 through sputtering as an underlayer of the wiring pattern 11. As illustrated in FIG. 9C, a resist pattern 19 is formed on the copper layer 18. For example, the resist pattern 19 is formed by applying photoresist to the surface of the copper layer 18 and then exposing and developing the photoresist using a photomask.

Figure 9D:
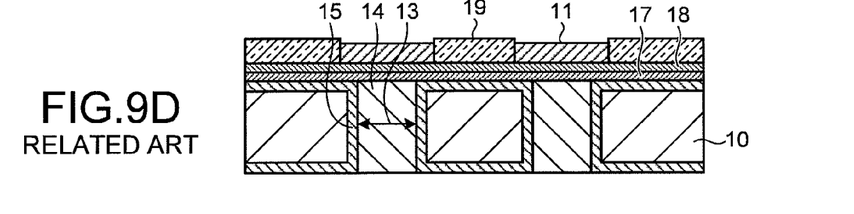
Figure 9E:
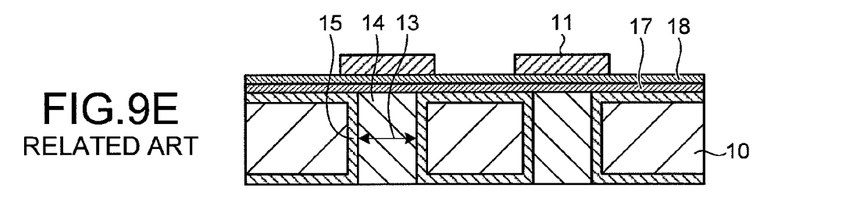
Figure 9F:
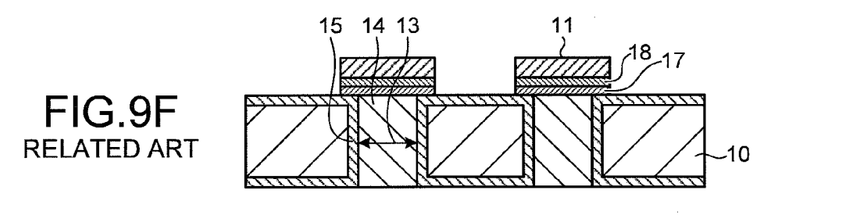

As illustrated in FIG. 9D, the wiring pattern 11 is formed on the copper layer 18 through electrolytic copper plating. After the formation of the wiring pattern 11, the resist pattern 19 is stripped as illustrated in FIG. 9E. Next, as illustrated in FIG. 9F, etching is performed to remove the titanium layer 17 and the copper layer 18 located at places where the resist pattern 19 has been stripped off.

Through the manufacturing process as described above, the interposer comes to have the titanium layer 17 as an adhesive layer between the wiring pattern 11 and the through electrode 14 and between the wiring pattern 11 and the oxide layer 15. Furthermore, through the same process, the titanium layer as an adhesive layer is also formed between the wiring pattern 12, which is formed on the other surface of the silicon substrate 10, and the through electrode 14, and between the wiring pattern 12 and the oxide layer 15.

Patent Document 1: Japanese Laid-open Patent Publication No. 2009-277895.

SUMMARY

According to an aspect of the embodiment, a wiring substrate includes a wiring layer made of copper; an electrode layer made of copper; and an insulating layer arranged adjacent to the electrode layer, wherein the wiring layer is stacked on the electrode layer and the insulating layer, the insulating layer and the wiring layer are stacked with an adhesive layer interposed between the wiring insulating layer and the wiring layer, and the electrode layer and the wiring layer are stacked without the adhesive layer interposed between the electrode layer and the wiring layer.

The object and advantages of the embodiment will be realized and attained by means of the elements and combinations particularly pointed out in the claims.

It is to be understood that both the foregoing general description and the following detailed description are exemplary and explanatory and are not restrictive of the claimed invention.

DESCRIPTION OF EMBODIMENTS

As described previously, in the wiring substrate having the multi-layer structure as described above, there is a situation in which an adhesive layer is formed between a wiring layer and an insulating layer or between a wiring layer and an electrode layer to improve the adhesion property between the layers. However, in the above-described related art, a connection between an electrode layer (a through electrode) and a copper wiring layer may not be ensured as will be described below.

Figure 10A:
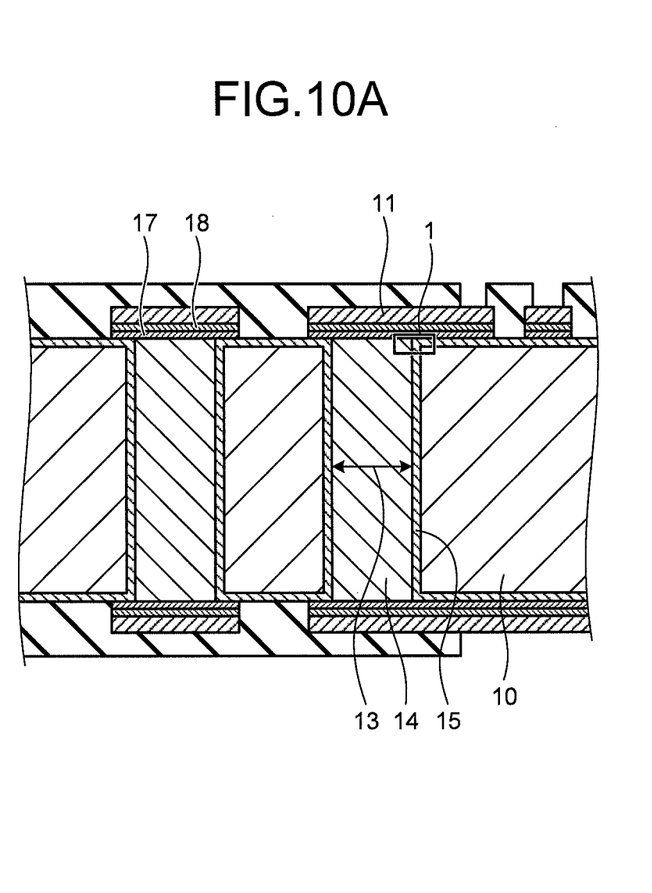
FIGS. 10A and 10B are diagrams for explaining problems of the related art.
Figure 10B:
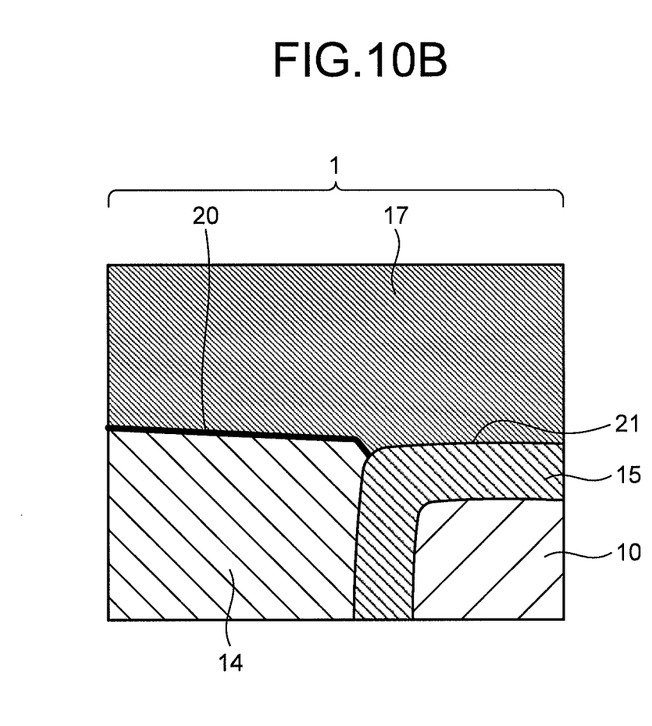

FIGS. 10A and 10B are diagrams for explaining the problem of the conventional art. FIG. 10A is a sectional view illustrating the vicinity of the through electrode 14 of the interposer illustrated in FIG. 8. Furthermore, FIG. 10B is an enlarged view illustrating a joining portion 1 between the oxide layer 15 and the titanium layer 17 illustrated in FIG. 10A. As illustrated in FIG. 10B, the through electrode 14 is joined with the titanium layer 17 at an interface 20, and the oxide layer 15 is joined with the titanium layer 17 at an interface 21.

The oxide layer 15 and the titanium layer 17 are reported to have high adhesion with respect to each other. On the other hand, since titanium is a metal which is not diffused into copper, adhesion between the through electrode 14 made of copper and the titanium layer 17 is lower than that between the oxide layer 15 and the titanium layer 17. Therefore, for example, when the interposer is repeatedly subjected to a thermal load, the through electrode 14, the oxide layer 15, and the titanium layer 17 with different thermal expansion coefficients repeatedly expand and contract. As a result, delamination may occur in the interface 20 between the through electrode 14 and the titanium layer 17. Due to the delamination, an electrical connection between the electrode layer and the copper wiring layer may not be ensured. In addition, when the wiring pattern 11 or the copper layer 18 is directly stacked on the oxide layer 15, delamination may occur between the oxide layer 15 and the wiring pattern 11 or between the oxide layer 15 and the copper layer 18.

The same problem may occur not only in the case where an insulating layer is an oxide layer and an adhesive layer is a titanium layer but also in the case where an insulating layer and an adhesive layer are made of different materials.

A wiring substrate and a manufacturing method of the wiring substrate according to preferred embodiments of the invention will be described in detail with reference to accompanying drawings. In addition, the following first to fourth embodiments are described with cases where the wiring substrate and the manufacturing method thereof are applied to an interposer. However, the technology disclosed herein is not limited thereto. Furthermore, in drawings referred in the following first to fourth embodiments, parts performing the same function are labled with the same type of hatching.

[a] First Embodiment

[Structure of Interposer According to First Embodiment]

Figure 1:
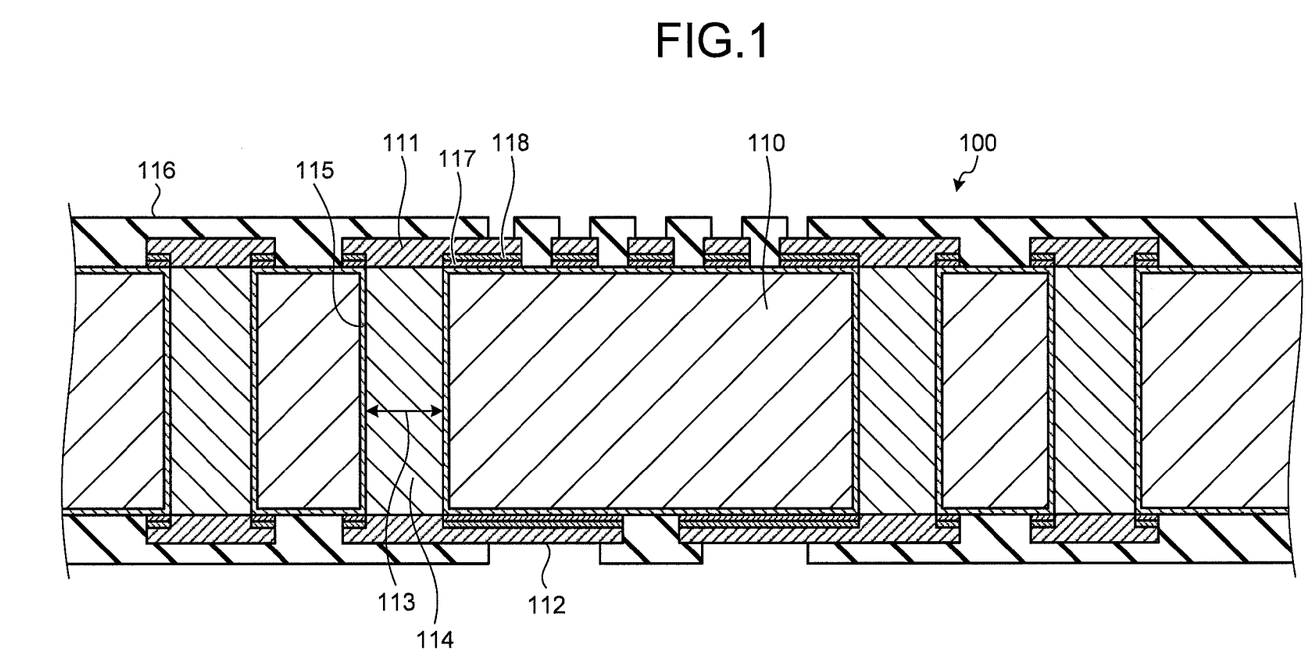
FIG. 1 is a sectional view illustrating the structure of an interposer according to a first embodiment.

The structure of an interposer according to the first embodiment will be described first. FIG. 1 is a sectional view illustrating the structure of an interposer 100 according to a first embodiment. As illustrated in FIG. 1, the interposer 100 according to the first embodiment is formed using a silicon substrate 110 as a base and includes a wiring pattern 111 and a wiring pattern 112. The wiring pattern 111 is formed on a surface of the silicon substrate 110. The wiring pattern 112 is formed on the other surface of the silicon substrate 110. Furthermore, the interposer 100 includes a through electrode 114 formed in a through hole 113 passing through the silicon substrate 110. The through electrode 114 electrically connects the wiring pattern 111 to the wiring pattern 112.

Then, an oxide layer 115 serving as an insulating layer is formed on the outer surface of the silicon substrate 110 and the inner wall surface of the through hole 113. Furthermore, a titanium (Ti) layer 117 serving as an adhesive layer is formed between the wiring pattern 111 and the oxide layer 115. Furthermore, a copper layer 118 serving as an underlayer of the wiring pattern 111 is formed between the wiring pattern 111 and the titanium layer 117. In addition, in the same manner, a titanium layer and a copper layer are also formed between the wiring pattern 112 and the oxide layer 115. Moreover, the surfaces of the wiring pattern 111 and the wiring pattern 112, for example, are coated with an insulating layer 116 made of polyimide.

In the interposer 100, the wiring pattern 111 is made of copper and the through electrode 114 is also made of copper. Furthermore, the oxide layer 115 is disposed adjacent to the through electrode 114. Furthermore, the wiring pattern 111 is stacked on the through electrode 114 and the oxide layer 115. Moreover, the oxide layer 115 and the wiring pattern 111 are stacked with the titanium layer 117 as an adhesive layer interposed between the oxide layer 115 and the wiring pattern 111. Furthermore, the through electrode 114 and the wiring pattern 111 are stacked without the titanium layer 117 interposed between the through electrode 114 and the wiring pattern 111. In addition, in the same manner, the wiring pattern 112 is also stacked on the through electrode 114 without the titanium layer interposed between the wiring pattern 112 and the through electrode 114.

That is, in the interposer 100 according to the first embodiment, the titanium layer 117 having high adhesion with respect to the oxide layer 115 is stacked on the oxide layer 115. Meanwhile, the wiring pattern 111 is stacked on the through electrode 114 without the titanium layer 117 interposed between the through electrode 114 and the titanium layer 117. Here, since the through electrode 114 and the wiring pattern 111 are made of the same copper, they have high adhesion to each other. Consequently, according to the first embodiment, it is possible to ensure a connection between the through electrode 114 (an electrode layer) and the wiring pattern 111 (a copper wiring layer) while maintaining adhesion between the oxide layer 115 (an insulating layer) and the titanium layer 117. Furthermore, since the through electrode 114 and the wiring pattern 111 are stacked without the titanium layer 117 interposed between the through electrode 114 and the wiring pattern 111, no delamination occurs in an interface between the through electrode 114 and the titanium layer 117.

[Manufacturing Method of Interposer According to First Embodiment]

Next, a manufacturing method of the interposer 100 according to the first embodiment will be described. FIGS. 2A to 2F are diagrams illustrating the manufacturing method of the interposer 100 according to the first embodiment. FIGS. 2A to 2F illustrate the sections of the interposer 100 in each step.

Figure 2A:
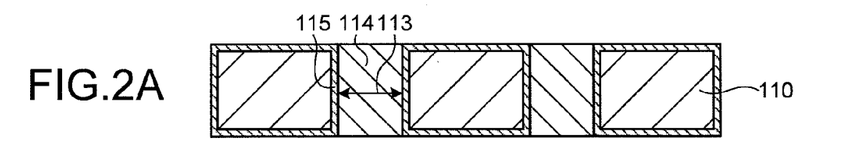
FIGS. 2A to 2F are diagrams illustrating a manufacturing method of an interposer according to a first embodiment.

First, as illustrated in FIG. 2A, the oxide layer 115 is formed on the outer surface of the silicon substrate 110 and the inner wall surface of the through hole 113 formed in the silicon substrate 110. For example, the oxide layer 115 is formed by forming a silicon dioxide (SiO$_2$) layer through thermal oxidation on the outer surface of the silicon substrate 110 and the inner wall surface of the through hole 113. For example, when the silicon substrate 110 has a thickness of about 200 µm, the through hole 113 is formed with a diameter of about 20 µm to about 100 µm. Furthermore, an interval between through holes 113 is about 50 µm to about 400 µm. Furthermore, the oxide layer 115 is formed to have a thickness of about 1 µm to about 2 µm. After the oxide layer 115 is formed, the through electrode 114 is formed in the through hole 113. For example, the through electrode 114 is formed by filling the through hole 113 with copper plating by a method of electrolytic copper plating. As a result of forming the through electrode 114 as described above, the through electrode 114 and the oxide layer 115 are arranged adjacent to each other in the vicinity of the outer surface of the silicon substrate 110 and the through electrode 114.

Figure 2B:
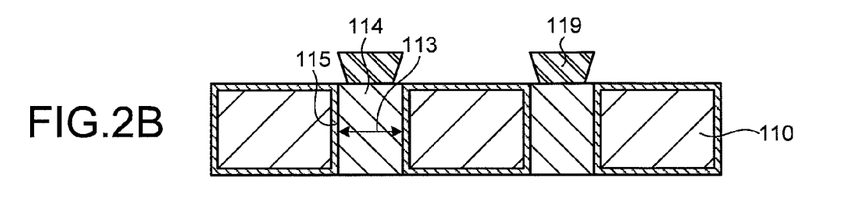
Figure 3:
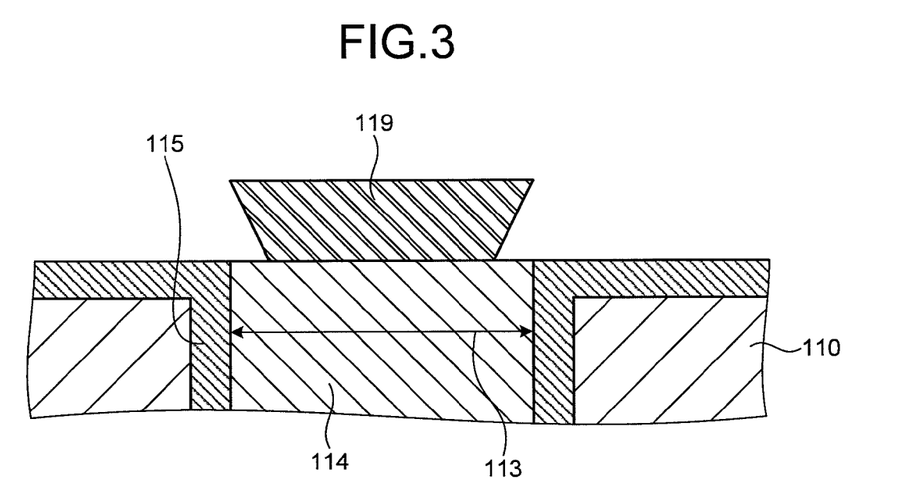
FIG. 3 is a diagram illustrating an example of the shape of a sacrificial layer according to the first embodiment.

As illustrated in FIG. 2B, a sacrificial layer 119 is formed on the surface (the end surface) of the through electrode 114. In the first embodiment, the sacrificial layer 119 is formed in such a manner that an area of the surface of the sacrificial layer 119 that makes contact with the through electrode 114 is smaller than an area of the opposite surface of the sacrificial layer 119. FIG. 3 is a diagram illustrating an example of the shape of the sacrificial layer 119 according to the first embodiment. For example, as illustrated in FIG. 3, the sacrificial layer 119 is formed in such a manner that an end portion of the sacrificial layer 119 protrudes more outward as the sacrificial layer 119 becomes far from the through electrode 114.

For example, the sacrificial layer 119 having the shape described above is obtained using photoresist for lift-off. In such a case, the sacrificial layer 119 is formed by applying the photoresist for lift-off to a surface of the silicon substrate 110 that has the surface of the through electrode 114, and then exposing and developing the photoresist using a photomask. For example, the sacrificial layer 119 may be made of an electrodeposited polyimide layer or an electroless nickel plating layer. In such a case, a polyimide or nickel layer grows thick from the surface of the through electrode 114, so that it is possible to obtain the sacrificial layer 119 having a shape in which an end portion thereof rises while protruding outward.

In addition, in any case, the sacrificial layer 119 is made of a material dissolved by a stripping liquid not reacting with copper. Consequently, it is possible to prevent the through electrode 114 from being affected by a stripping liquid to be used when removing the sacrificial layer 119 later.

In general, a natural oxide layer is formed on the surface of copper due to oxygen in the air. In the first embodiment, since the sacrificial layer 119 is formed on the surface of the through electrode 114 after the formation of the through electrode 114, it is possible to prevent a natural oxide layer from being formed on the surface of the through electrode 114. Consequently, it is possible to improve adhesion between the wiring pattern 111 to be formed later and the through electrode 114.

Figure 2C:
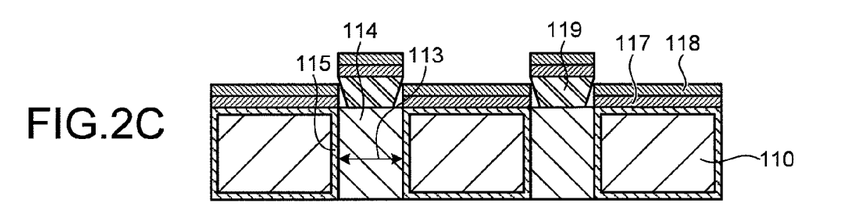

As illustrated in FIG. 2C, the titanium layer 117 is formed on the surface of the oxide layer 115 and the surface of the sacrificial layer 119. The titanium layer 117 serves as an adhesive layer formed between the wiring pattern 111 and the oxide layer 115. Then, the copper layer 118 serving as an underlayer of the wiring pattern 111 is formed on the titanium layer 117. For example, the titanium layer 117 and the copper layer 118 are formed through sputtering.

Figure 4:
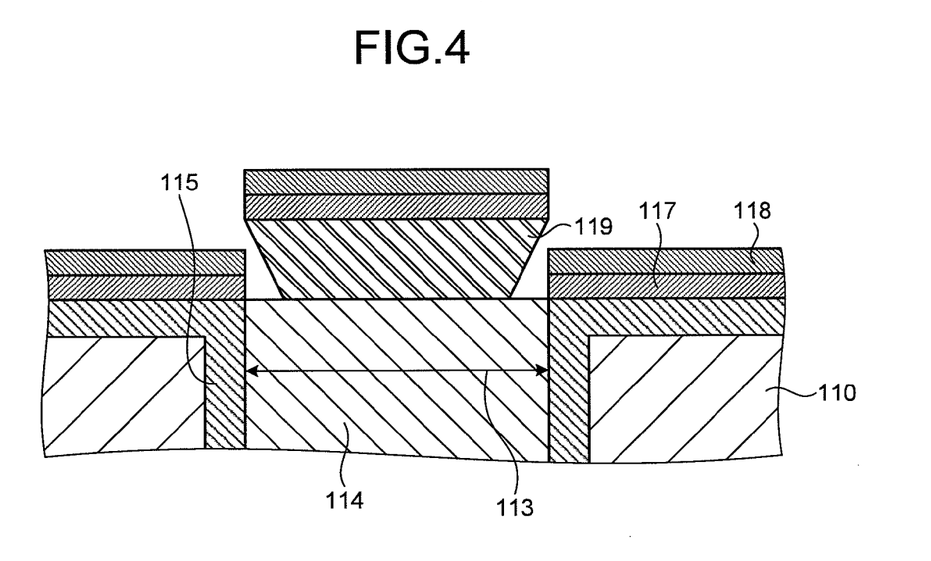
FIG. 4 is a diagram illustrating an example of a titanium layer and a copper layer according to the first embodiment.

FIG. 4 is a diagram illustrating an example of the titanium layer 117 and the copper layer 118 according to the first embodiment. As illustrated in FIG. 4, the sum of the thicknesses of the titanium layer 117 and the copper layer 118 stacked on the oxide layer 115 is smaller than the thickness of the sacrificial layer 119. In other words, the sacrificial layer 119 may have a thickness larger than the sum of the thicknesses of the titanium layer 117 and the copper layer 118. Therefore, steps may be formed by the stacked titanium layer 117 and copper layer 118 and the sacrificial layer 119. Due to the steps, when the titanium layer 117 and the copper layer 118 are formed through sputtering, there may be formed a gap for allowing a stripping liquid to permeate into the periphery of the sacrificial layer 119.

Figure 2D:
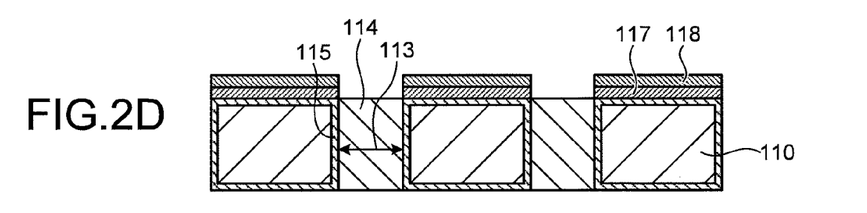

As illustrated in FIG. 2D, the sacrificial layer 119, and the titanium layer 117 and the copper layer 118, which are formed on the sacrificial layer 119, are removed. For example, the sacrificial layer 119, the titanium layer 117, and the copper layer 118 are simultaneously removed through lift-off. As mentioned before, in the first embodiment, since the gap is formed which allows the stripping liquid to permeate into the periphery of the sacrificial layer 119, it is possible to reliably remove the sacrificial layer 119 through the lift-off.

Furthermore, as mentioned before, in the first embodiment, the sacrificial layer 119 is made of a material dissolved by a stripping liquid not reacting with copper. For this reason, when removing the sacrificial layer 119 through the lift-off, used is the stripping liquid not reacting with the copper. For example, when forming the sacrificial layer 119 using electrodeposited polyimide, a solvent such as dimethylsolfoxide or monoethanolamine is used as the stripping liquid. Consequently, it is possible to remove the sacrificial layer 119 without having an influence on the through electrode 114.

In addition, in the case where it is impossible to thinly form the titanium layer 117 and the copper layer 118, when forming the titanium layer 117 and the copper layer 118 through sputtering, a gap may not be sufficiently formed at the periphery of the sacrificial layer 119. In such a case, for example, the titanium layer 117 and the copper layer 118 are polished through chemical mechanical polishing (CMP) so that the sacrificial layer 119 may be exposed. After that, the sacrificial layer 119 is removed using the stripping liquid.

Figure 2E:
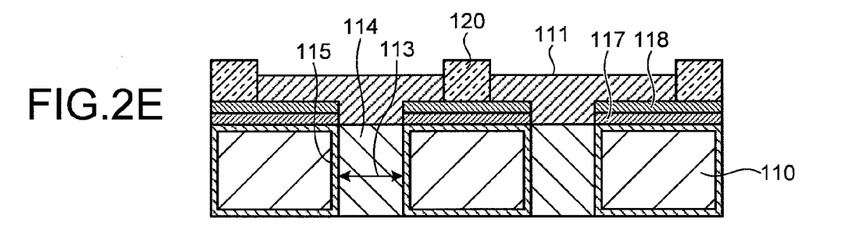

As illustrated in FIG. 2E, a resist pattern 120 is formed on the copper layer 118. For example, the resist pattern 120 is formed by applying photoresist to the surface of the copper layer 118 and then exposing and developing the photoresist using a photomask. Then, the wiring pattern 111 is formed on both the surface of the through electrode 114, which is exposed by removing the sacrificial layer 119, and on the copper layer 118. For example, the wiring pattern 111 is formed through electrolytic copper plating using the titanium layer 117 and the copper layer 118 as a power feeding layer.

Figure 2F:
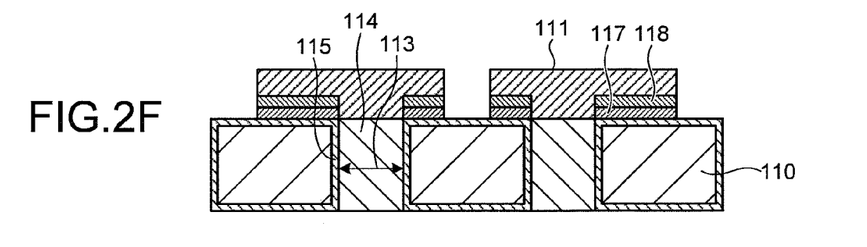

As illustrated in FIG. 2F, the resist pattern 120 is stripped off. Then, the titanium layer 117 and the copper layer 118 are removed, which exist at the place where the resist pattern 120 has been stripped off. For example, the titanium layer 117 and the copper layer 118 are removed through dry etching, wet etching, milling, or the like.

Through the above-described manufacturing process, the wiring pattern 111, the titanium layer 117, and the copper layer 118 are formed on a surface of the silicon substrate 110. Then, through the same process, the wiring pattern 112, the titanium layer, and the copper layer are formed on the other surface of the silicon substrate 110. Consequently, the interposer 100 illustrated in FIG. 1 is obtained.

[Effects of First Embodiment]

As described above, the interposer 100 according to the first embodiment includes the wiring pattern 111 made of copper. Furthermore, the interposer 100 includes the through electrode 114 made of copper. Furthermore, the interposer 100 includes the oxide layer 115 arranged adjacent to the through electrode 114. Furthermore, the wiring pattern 111 is stacked on the through electrode 114 and the oxide layer 115. The oxide layer 115 and the wiring pattern 111 are stacked with the titanium layer 117 interposed therebetween. Furthermore, the through electrode 114 and the wiring pattern 111 are directly stacked without the titanium layer 117 interposed therebetween. Consequently, according to the first embodiment, it is possible to ensure a connection between the through electrode 114 and the wiring pattern 111 while maintaining adhesion property between the oxide layer 115 and the titanium layer 117. Furthermore, since the through electrode 114 and the wiring pattern 111 are stacked without the titanium layer 117 interposed therebetween, no delamination occurs in the interface between the through electrode 114 and the titanium layer 117.

Furthermore, in the manufacturing method of the interposer 100 according to the first embodiment, the sacrificial layer 119 is formed on the surface of the through electrode 114 arranged adjacent to the oxide layer 115. Furthermore, the titanium layer 117 is formed on the surface of the oxide layer 115 and the surface of the sacrificial layer 119. Furthermore, the sacrificial layer 119 and the titanium layer 117 formed on the sacrificial layer 119 are removed. Furthermore, the wiring patterns 111 and 112 are formed on the surface of the through electrode 114 exposed by removing the sacrificial layer 119. Consequently, according to the first embodiment, it is possible to obtain the interposer 100 capable of ensuring a connection between the through electrode 114 and the wiring patterns 111 and 112 while maintaining adhesion property between the oxide layer 115 and the titanium layer 117.

Furthermore, in the manufacturing method of the interposer 100 according to the first embodiment, the sacrificial layer 119 is formed in such a manner that an area of the surface of the sacrificial layer 119 making contact with the through electrode 114 is smaller than an area of the opposite surface of the sacrificial layer. Furthermore, the titanium layer 117 is formed to have a thickness thinner than that of the sacrificial layer 119. Then, the sacrificial layer 119 and the titanium layer 117 on the sacrificial layer 119 are simultaneously removed through the lift-off. Consequently, according to the first embodiment, since a gap for allowing a stripping liquid to permeate into the periphery of the sacrificial layer 119 is formed, it is possible to reliably remove the sacrificial layer 119 through the lift-off.

Furthermore, in the manufacturing method of the interposer 100 according to the first embodiment, the sacrificial layer 119 is made of a material dissolved by a stripping liquid not reacting with copper. Then, the sacrificial layer 119 is removed using the stripping liquid not reacting with the copper. Consequently, it is possible to remove the sacrificial layer 119 without having an influence on the through electrode 114.

[b] Second Embodiment

In the first embodiment, the manufacturing method using the sacrificial layer 119 has been described. However, the technology disclosed herein is not limited thereto. That is, it is possible to manufacture the interposer 100 illustrated in FIG. 1 without using the sacrificial layer 119. Hereinafter, described will be a manufacturing method of the interposer 100 using patterning according to the second embodiment.

[Manufacturing Method of Interposer According to Second Embodiment]

FIGS. 5A to 5F are diagrams illustrating a manufacturing method of the interposer 100 according to a second embodiment. FIGS. 5A to 5F illustrate the sections of the interposer 100 in each step.

Figure 5A:
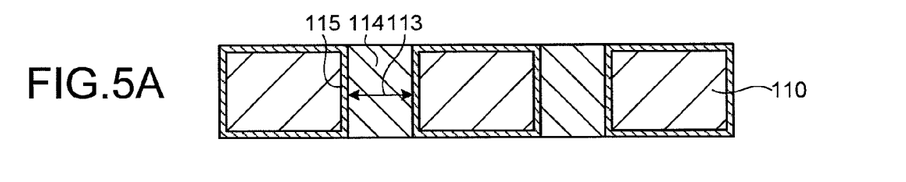
FIGS. 5A to 5F are diagrams illustrating a manufacturing method of an interposer according to a second embodiment.

First, as illustrated in FIG. 5A, an oxide layer 115 is formed on the outer surface of a silicon substrate 110 and the inner wall surface of a through hole 113 formed in the silicon substrate 110. For example, the oxide layer 115 is formed by forming a silicon dioxide layer on the outer surface of the silicon substrate 110 and the inner wall surface of the through hole 113 through thermal oxidation. For example, when the silicon substrate 110 has a thickness of about 200 μm, the through hole 113 is formed with a diameter of about 20 μm to about 100 μm. Furthermore, an interval between through holes 113 is about 50 μm to about 400 μm. Furthermore, the oxide layer 115 is formed with a thickness of about 1 μm to about 2 μm. After the oxide layer 115 is formed, the through electrode 114 is formed in the through hole 113. For example, the through electrode 114 is formed by filling the through hole 113 with copper through electrolytic copper plating. As a result of forming the through electrode 114 as described above, the through electrode 114 and the oxide layer 115 are arranged adjacent to each other in the vicinity of the surface of the silicon substrate 110.

Figure 5B:
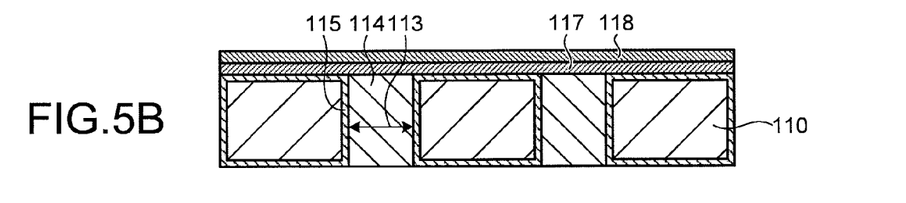

As illustrated in FIG. 5B, the titanium layer 117 is formed on the surface of the oxide layer 115 and the surface of the through electrode 114. The titanium layer 117 serves as an adhesive layer formed between the wiring pattern 111 and the oxide layer 115. Then, the copper layer 118 serving as an underlayer of the wiring pattern 111 is formed on the titanium layer 117. For example, the titanium layer 117 and the copper layer 118 are formed through sputtering.

Figure 5C:
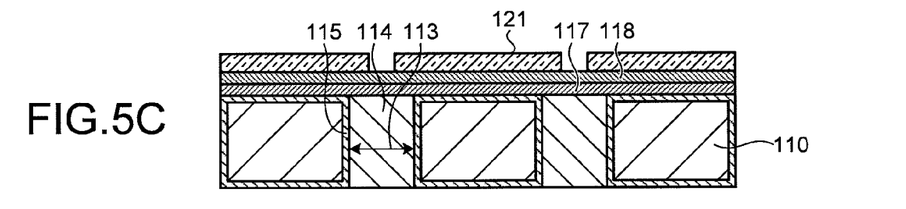

As illustrated in FIG. 5C, a resist pattern 121 with an opening hole formed at the position where the through electrode 114 exists is formed on the surface of the copper layer 118. For example, the resist pattern 121 is formed by applying photoresist onto the surface of the copper layer 118 and then exposing and developing the photoresist using a photomask.

Figure 5D:
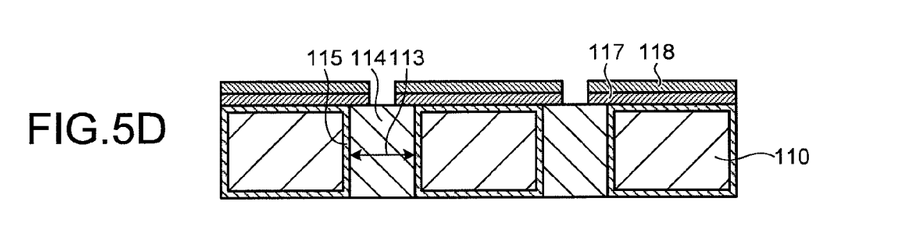

As illustrated in FIG. 5D, the titanium layer 117 and the copper layer 118 on the through electrode 114 are removed using the resist pattern 121 as a resist mask. For example, the titanium layer 117 and the copper layer 118 are removed through dry etching, wet etching, milling or the like. Then, the resist pattern 121 is stripped.

Figure 5E:
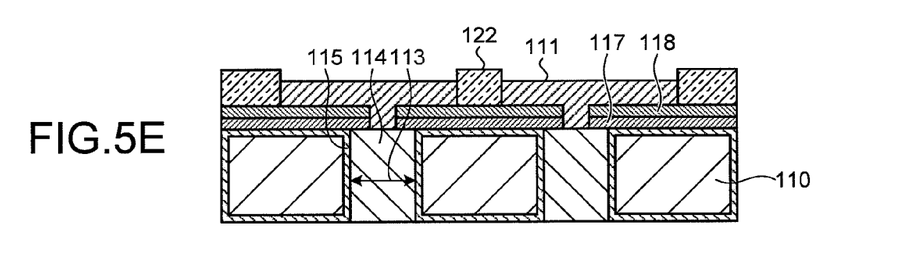

As illustrated in FIG. 5E, a resist pattern 122 with an opening hole formed at the position, where the wiring pattern 111 is to be formed, is formed on the copper layer 118 exposed by stripping of the resist pattern 121. For example, the resist pattern 122 is formed by applying photoresist to the surface of the copper layer 118 and then exposing and developing the photoresist using a photomask. Then, the wiring pattern 111 is formed on both the surface of the through electrode 114, which is exposed by removing the titanium layer 117 and the copper layer 118, and the copper layer 118. For example, the wiring pattern 111 is formed through electrolytic copper plating, using the titanium layer 117 and the copper layer 118 as a power feeding layer.

Figure 5F:
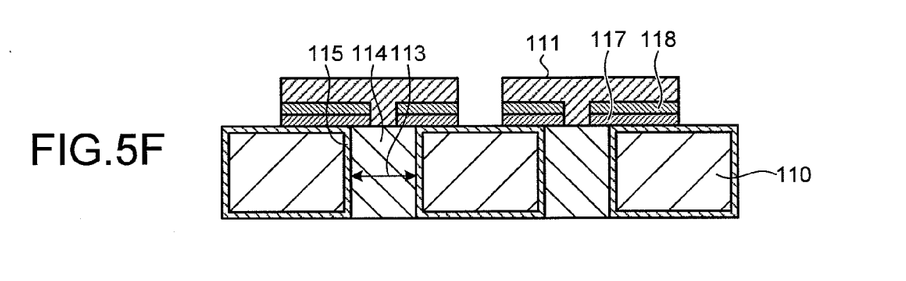

As illustrated in FIG. 5F, the resist pattern 122 is stripped off. Then, the titanium layer 117 and the copper layer 118 are removed, which exist at the place where the resist pattern 122 has been stripped off. For example, the titanium layer 117 and the copper layer 118 are removed through dry etching, wet etching, milling or the like.

Through the above-described manufacturing process, the wiring pattern 111, the titanium layer 117, and the copper layer 118 are formed on a surface of the silicon substrate 110. Then, through the same process, the wiring pattern 112, the titanium layer 117, and the copper layer 118 are formed on the other surface of the silicon substrate 110. Consequently, the interposer 100 illustrated in FIG. 1 is obtained.

[Effects of Second Embodiment]

As described above, in the manufacturing method of the interposer 100 according to the second embodiment, the titanium layer 117 is formed on the surface of the oxide layer 115 and the surface of the through electrode 114 arranged adjacent to the oxide layer 115. Furthermore, the resist pattern 121 with the opening hole disposed on the through electrode 114 is formed on the titanium layer 117. Furthermore, the titanium layer 117 on the through electrode 114 is removed using the resist pattern 121 as a resist mask. Then, the wiring patterns 111 and 112 are formed on the surface of the through electrode 114 exposed by removing the titanium layer 117. That is, according to the second embodiment, even if it is not possible to form the sacrificial layer 119 on the surface of the through electrode 114 through electrodeposition or electroless plating, it is possible to stack the through electrode 114 and the wiring patterns 111 and 112 through patterning. Consequently, according to the manufacturing method of the second embodiment, similarly to the first embodiment, it is possible to ensure a connection between the through electrode 114 and the wiring pattern 111 while maintaining adhesion property between the oxide layer 115 and the titanium layer 117. Furthermore, since the through electrode 114 and the wiring pattern 111 are stacked without the titanium layer 117 interposed therebetween, no delamination occurs in an interface between the through electrode 114 and the titanium layer 117.

[c] Third Embodiment

In the first and second embodiments, the case where the through electrode is connected to the wiring pattern has been described. However, the technology disclosed herein is not limited thereto. For example, the technology disclosed herein can also be applied in the same manner to the case where wiring patterns of respective layers are connected to each other through via-holes. In addition, the via-hole referred to herein is a hole formed in an interlayer dielectric layer in order to electrically connect wirings formed on different layers to each other. Hereinafter, an interposer with a via-hole according to the third embodiment will be described.

Figure 6:
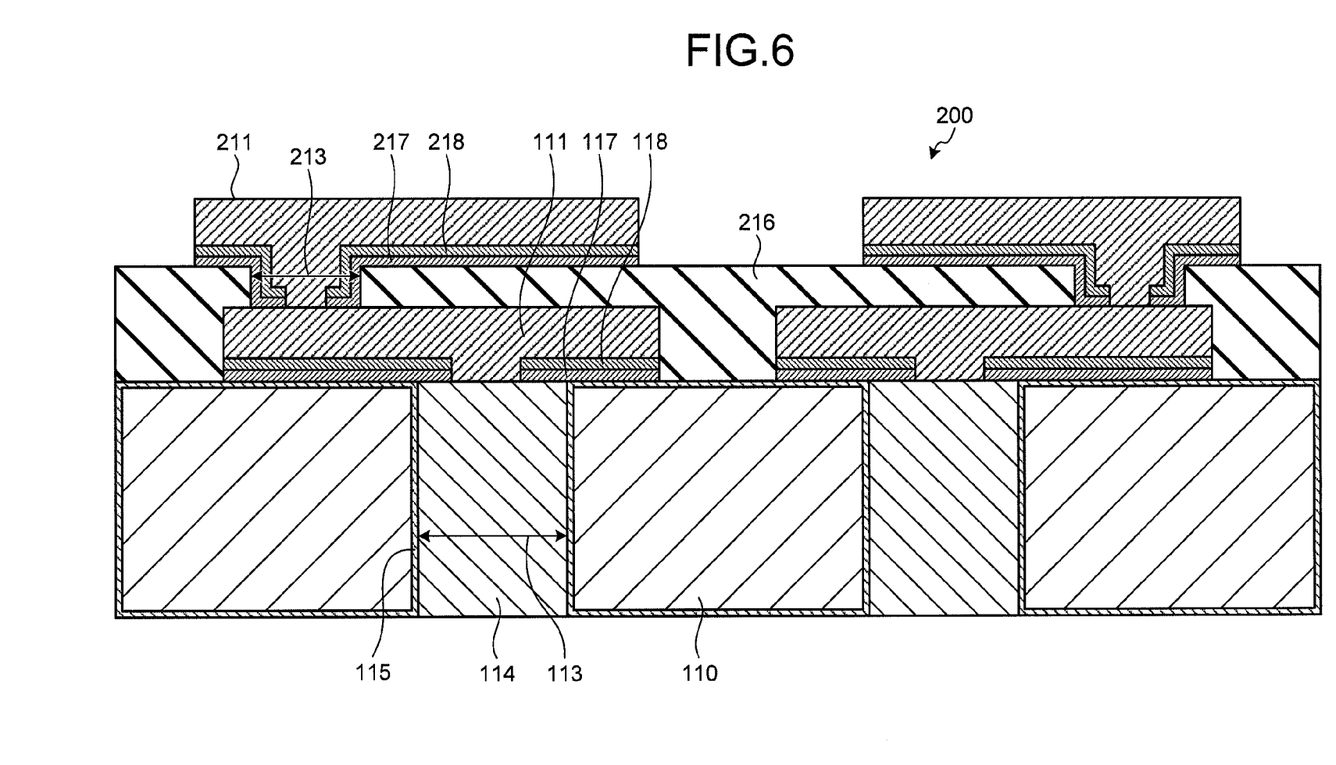
FIG. 6 is a sectional view illustrating the structure of an interposer according to a third embodiment.

FIG. 6 is a sectional view illustrating the structure of an interposer 200 according to the third embodiment. As illustrated in FIG. 6, the interposer 200 according to the third embodiment is formed using a silicon substrate 110 as a base and includes wiring patterns 111 and 211. Furthermore, the interposer 200 includes a through electrode 114 formed in a through hole 113 passing through the silicon substrate 110.

The wiring pattern 111 is stacked on the silicon substrate 110 and the through electrode 114. The wiring pattern 211 is stacked on the wiring pattern 111 via an interlayer dielectric layer 216. For example, the interlayer dielectric layer 216 is made of polyimide, silicon dioxide, epoxy, or the like. The through electrode 114 electrically connects the wiring patterns 111 and 211, which are formed on a surface of the silicon substrate 110, to wiring patterns (not illustrated) formed on the other surface thereof. Furthermore, the wiring pattern 111 is connected to the wiring pattern 211 through a via-hole 213 formed in the interlayer dielectric layer 216.

Then, the oxide layer 115 serving as an insulating layer is formed on the outer surface of the silicon substrate 110 and the inner wall surface of the through hole 113. Furthermore, the titanium layer 117 serving as an adhesive layer is formed between the wiring pattern 111 and the oxide layer 115. In addition, a copper layer 118 serving as an underlayer of the wiring pattern 111 is formed between the wiring pattern 111 and the titanium layer 117.

Here, the wiring pattern 111 is made of copper and the through electrode 114 is also made of copper. Furthermore, the oxide layer 115 is arranged adjacent to the through electrode 114. Furthermore, the wiring pattern 111 is stacked on the oxide layer 115 via the titanium layer 117. Moreover, the wiring pattern 111 is directly stacked on the through electrode 114 without the titanium layer 117 interposed between the wiring pattern 111 and the through electrode 114. Consequently, it is possible to ensure a connection between the through electrode 114 and the wiring pattern 111 while maintaining adhesion property between the oxide layer 115 and the titanium layer 117. In addition, the wiring pattern 111 described herein, for example, is formed using the manufacturing method described in the first embodiment or the second embodiment.

Moreover, a titanium layer 217 serving as an adhesive layer is formed between the wiring pattern 211 and the interlayer dielectric layer 216. Furthermore, a copper layer 218 serving as an underlayer of the wiring pattern 211 is formed between the wiring pattern 211 and the titanium layer 217. Here, the wiring patterns 111 and 211 are made of copper. Furthermore, the interlayer dielectric layer 216, which is an insulating layer, is arranged adjacent to the wiring pattern 211 in the via-hole 213. The wiring pattern 211 is stacked on the interlayer dielectric layer 216 with the titanium layer 217 interposed between the wiring pattern 211 and the interlayer dielectric layer 216. Furthermore, the wiring pattern 211 is stacked on the wiring pattern 111 without the titanium layer 217 interposed between the wiring pattern 111 and the titanium layer 217.

In addition, the layer between the wiring pattern 111 and the wiring pattern 211 described herein, for example, is formed through the manufacturing method using the patterning described in the second embodiment, as will be described below. First, the via-hole 213 is formed in the interlayer dielectric layer 216. For example, the via-hole 213 is formed by processing the interlayer dielectric layer 216 using a laser or the like. Then, the titanium layer 217 serving as an adhesive layer is formed on the surface of the interlayer dielectric layer 216, the inner wall surface of the via-hole 213, and the surface of the wiring pattern 111 exposed through the via-hole 213. In addition, the copper layer 218 serving as an underlayer of the wiring pattern 211 is formed on the surface of the titanium layer 217.

Then, the titanium layer 217 and the copper layer 218 positioned at the bottom of the via-hole 213 are removed using a resist pattern as a resist mask. Thereafter, a resist pattern with an opening hole formed at the position where the wiring pattern 211 is to be formed is formed on the copper layer 218. Next, the wiring pattern 211 is formed on the surface of the wiring pattern 111 exposed by removing the titanium layer 217 and the copper layer 218, and the surface of the interlayer dielectric layer 216. For example, the wiring pattern 211 is formed through electrolytic copper plating using the titanium layer 217 and the copper layer 218 as a power feeding layer. Thereafter, the resist pattern is stripped off, and the titanium layer 217 and the copper layer 218 are further removed, which exist at the place where the resist pattern has been stripped off.

As described above, in the interposer 200 according to the third embodiment, the wiring pattern 211 and the interlayer dielectric layer 216 are stacked with the titanium layer 217 interposed between the wiring pattern 211 and the interlayer dielectric layer 216. Furthermore, the wiring pattern 211 and the wiring pattern 111 are directly stacked without the titanium layer 217 interposed between the wiring pattern 211 and the wiring pattern 111 on the bottom surface of the via-hole 213. Consequently, according to the third embodiment, even when the wiring patterns of respective layers are connected to each other through the via-hole 213, it is possible to ensure a connection between the wiring pattern 211 and the wiring pattern 111 while maintaining adhesion property between the interlayer dielectric layer 216 and the titanium layer 217. Furthermore, since the wiring pattern 211 and the wiring pattern 111 are stacked without the titanium layer 217 interposed between the wiring pattern 211 and the wiring pattern 111, no delamination occurs in the interface between the wiring pattern 111 and the titanium layer 217.

[d] Fourth Embodiment

In the third embodiment, the case where the wiring patterns of respective layers are connected to each other through the via-hole has been described. However, the technology disclosed herein is not limited thereto. For example, the technology disclosed herein can also be applied in the same manner to the case where a wiring pattern is connected to a bump. In addition, the bump referred to herein is a protrusion electrode formed on the surface of an interposer. The bump connects a wiring included in the interposer to a wiring included in another substrate. Hereinafter, an interposer including the bump according to the fourth embodiment will be described.

Figure 7:
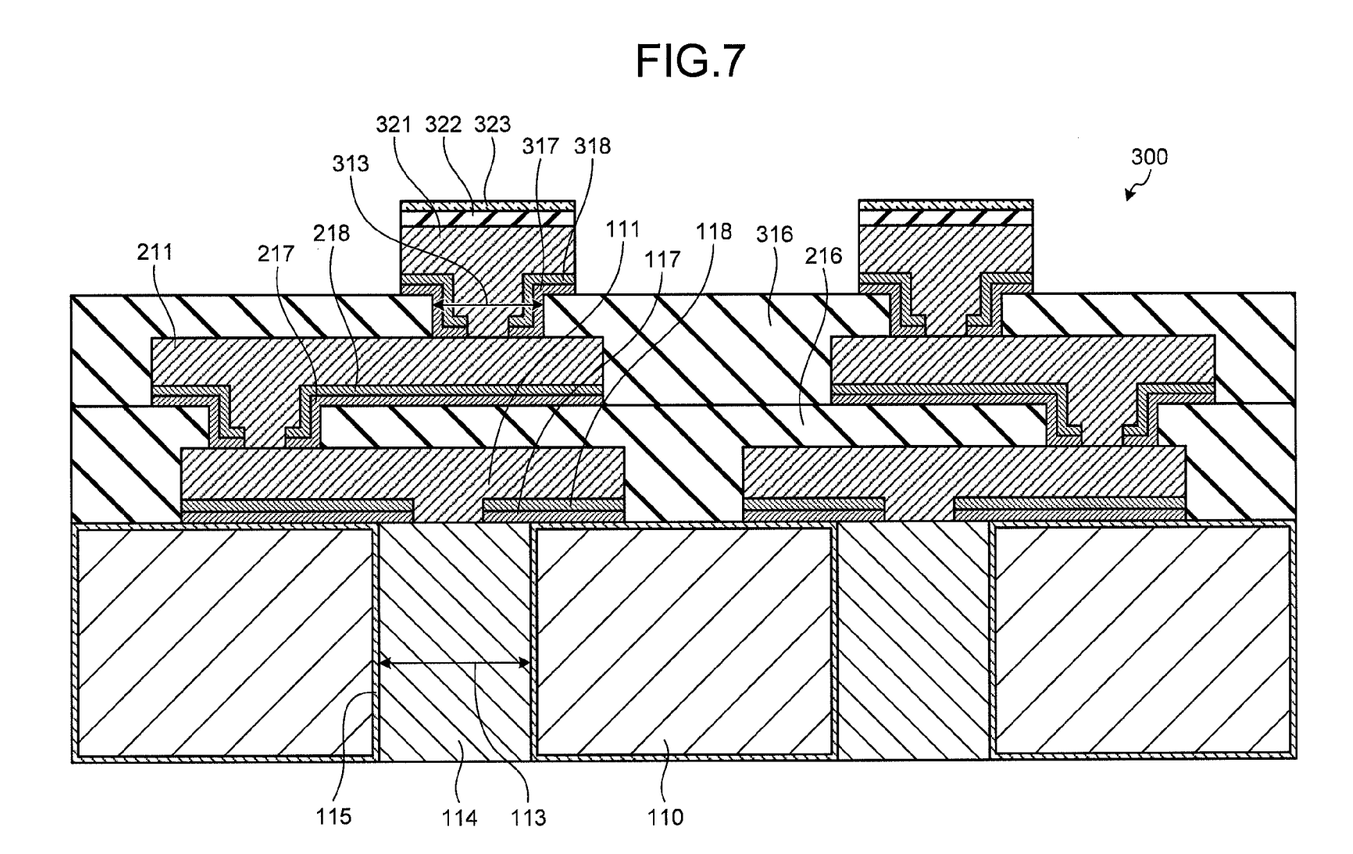
FIG. 7 is a sectional view illustrating the structure of an interposer according to a fourth embodiment.

FIG. 7 is a sectional view illustrating the structure of an interposer 300 according to a fourth embodiment. As illustrated in FIG. 7, the interposer 300 according to the fourth embodiment is formed by additionally mounting an interlayer dielectric layer 316 and a bump 321 on the interposer 200 illustrated in FIG. 6. The interlayer dielectric layer 316 is formed on the surface of the wiring pattern 211 and the surface of the interlayer dielectric layer 216. The interlayer dielectric layer 316, for example, is made of polyimide, silicon dioxide, epoxy, or the like.

A nickel (Ni) layer 322 is formed on the bump 321 to improve the connection reliability between another substrate and electronic parts, and a gold (Au) layer 323 is further formed on the surface of the nickel layer 322. For example, the nickel layer 322 and the gold layer 323 are formed through sputtering. In addition, a solder layer may be formed instead of the gold layer 323. The bump 321 is connected to the wiring pattern 211 through a via-hole 313 formed in the interlayer dielectric layer 316.

Then, a titanium layer 317 serving as an adhesive layer is formed between the bump 321 and the interlayer dielectric layer 316. In addition, a copper layer 318 serving as an underlayer of the bump 321 is formed between the titanium layer 317 and the bump 321. Here, the bump 321 and the wiring pattern 211 are made of copper. Furthermore, the interlayer dielectric layer 316, which is an insulating layer, is arranged adjacent to the bump 321 formed in the via-hole 313. The bump 321 is stacked on the interlayer dielectric layer 316 via the titanium layer 317. Furthermore, the bump 321 is directly stacked on the wiring pattern 211 without the titanium layer 317 interposed between the bump 321 and the wiring pattern 211.

In addition, the layer between the bump 321 and the wiring pattern 211 described herein, for example, is formed through the manufacturing method using the patterning described in the second embodiment, as will be described below. First, the via-hole 313 is formed in the interlayer dielectric layer 316. For example, the via-hole 313 is formed by processing the interlayer dielectric layer 316 using a laser or the like. Then, the titanium layer 317 serving as an adhesive layer is formed on the surface of the interlayer dielectric layer 316, the inner wall surface of the via-hole 313, and the surface of the wiring pattern 211 exposed through the via-hole 313. In addition, the copper layer 318 serving as an underlayer of the bump 321 is formed on the surface of the titanium layer 317.

Then, the titanium layer 317 and the copper layer 318 positioned at the bottom of the via-hole 313 are removed using a resist pattern as a resist mask. Thereafter, a resist pattern with an opening hole formed at the position where the bump 321 is to be formed is formed on the copper layer 318. Next, the bump 321 is formed on the surface of the wiring pattern 211 exposed by removing the titanium layer 317, and the surface of the copper layer 318. For example, the bump 321 is formed through electrolytic copper plating using the titanium layer 317 and the copper layer 318 as a power feeding layer. Thereafter, the nickel layer 322 is formed on the bump 321 through electrolytic plating, and the gold layer 323 is further formed on the surface of the nickel layer 322. Thereafter, the resist pattern is stripped off, and the titanium layer 317 and the copper layer 318 are further removed, which exist at the place where the resist pattern has been stripped off.

As described above, in the interposer 300 according to the fourth embodiment, the bump 321 and the interlayer dielectric layer 316 are stacked with the titanium layer 317 interposed between the bump 321 and the interlayer dielectric layer 316. Furthermore, the bump 321 and the wiring pattern 211 are stacked on the bottom surface of the via-hole 313 without intervention of the titanium layer 317. Consequently, according to the fourth embodiment, it is possible to ensure a connection between the bump 321 and the wiring pattern 211 while maintaining adhesion property between the interlayer dielectric layer 316 and the titanium layer 317. Furthermore, since the bump 321 and the wiring pattern 211 are stacked without the titanium layer 317 interposed between the bump 321 and the wiring pattern 211, no delamination occurs in the interface between the bump 321 and the titanium layer 317.

Furthermore, in the first to fourth embodiments, the interposer in which only the wiring is arranged on the silicon substrate has been described. However, the technology disclosed herein is not limited thereto. For example, the technology disclosed herein can also be applied in the same manner to the case where various devices such as logic circuits or analog circuits are formed on the silicon substrate 110.

Furthermore, in the first to fourth embodiments, the case has been described, in which the substrate of the interposer is made of the silicon substrate, the insulating layer is made of an oxide layer of silicon dioxide or polyimide, and the adhesive layer is made of a titanium layer. However, the technology disclosed herein is not limited thereto. For example, the technology disclosed herein can also be applied in the same manner to the case where the substrate of the interposer, the insulating layer, and the adhesive layer are made of other materials. Other materials referred to herein, for example, are an inorganic material such as glass or ceramic in connection with the substrate. Furthermore, for the insulating layer, Other materials referred to herein, for example, are an inorganic material such as glass or ceramic in connection with the substrate. Furthermore, in connection with the insulating layer, other materials, for example, are silicon nitride (SiN). Furthermore, in connection with the adhesive layer, other materials, for example, are chrome (Cr).

In addition, the first to fourth embodiments are applied to the interposer. However, the technology disclosed herein is not limited thereto. That is, the technology disclosed herein can also be applied in the same manner to other wiring substrates having a multi-layer structure.

Moreover, in the first to fourth embodiments, the case where the wiring pattern or the through electrode is made of copper has been described. However, the technology disclosed herein is not limited thereto. For example, the technology disclosed herein can also be applied in the same manner to the case where the wiring pattern or the through electrode is made of a copper alloy.

According to embodiments of a wiring substrate and a manufacturing method disclosed herein, it is possible to ensure a connection between an electrode layer and a copper wiring layer while maintaining adhesion between an insulating layer and an adhesive layer.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring substrate comprising;
   a wiring layer including a non-electrolytic plating layer formed by non-electrolytic plating and an electrolytic plating layer formed by electrolytic plating stacked directly on the non-electrolytic, plating layer the wiring layer being made of copper;
   a silicon substrate having a first surface and a second surface, said silicon substrate having a through hole, said through hole being formed so as to penetrate the silicon substrate from the first surface toward the second surface;
   a through electrode made of copper filled into the through hole;
   an insulating layer made of silicon dioxide and arranged adjacent to the through electrode, said insulating layer being directly stacked on the silicon substrate and covering the first surface and the second surface of the silicon substrate and an inner wall surface of the through hole, and wherein a side surface of the through electrode is in contact only with the insulating layer; and,
   an adhesive layer made of titanium, said adhesive layer formed only outside the through hole directly on a surface of the insulating layer and formed on at least one of the first surface and second surface of the silicon substrate,
   wherein the insulating laver, the adhesive laver, the non-electrolytic plating layer, and the electrolytic plating layer are formed and arranged on the silicon substrate in this order,
   the electrolytic plating layer is stacked directly on an end surface of the through electrode,
   the wiring layer is made on at least one of the first surface and the second surface of the silicon substrate via the adhesive layer and the insulating layer,
   the insulating layer and the wiring layer are stacked with the adhesive layer interposed between the insulating layer and the wiring layer,
   the non-electrolytic plating layer is stacked directly on the adhesive layer, and the non-electrolytic plating layer and the adhesive layer are formed only directly below the electrolytic plating layer, and
   the through electrode and the wiring layer are stacked in contact with each other.

2. The wiring substrate according to claim 1, wherein a part of the through electrode and the wiring layer are stacked with the adhesive layer interposed between the part of the through electrode and the wiring layer.

3. A wiring substrate comprising:
   a wiring layer including a non-electrolytic plating layer formed by non-electrolytic plating and an electrolytic plating layer formed by electrolytic plating and stacked directly on the non-electrolytic plating layer, the wiring layer being made of copper;
   a silicon substrate having a first surface and a second surface, said silicon substrate having a through hole, said through hole being formed so as to penetrate the silicon substrate from the first surface toward the second surface;
   a through electrode made of copper filled into the through hole;
   an insulating layer made of silicon dioxide and arranged adjacent to the through electrode, said insulating layer being directly stacked on the silicon substrate and covering the first surface and the second surface of the silicon substrate and an inner wall surface of the through hole, and wherein a side surface of the through electrode is in contact only with the insulating layer; and
   an adhesive layer made of titanium, said adhesive layer formed only outside the through hole on a surface of the insulating layer and formed on at least one of the first surface and the second surface of the silicon substrate, the adhesive layer made of titanium not being formed on the inner wall surface of the through hole,
   wherein the insulating layer, the adhesive layer, the non-electrolytic plating layer, and the electrolytic plating layer are formed and arranged on the silicon substrate in this order,
   the electrolytic plating layer is stacked directly on an end surface of the through electrode,
   the wiring layer is made on at least one of the first surface and the second surface of the silicon substrate via the adhesive layer and the insulating layer,
   the insulating layer and the wiring layer are stacked with the adhesive layer interposed between the insulating layer and the wiring layer,
   the no electrolytic planting layer is stacked directly on the adhesive layer, and the non-electrolytic planting layer and the adhesive layer are formed only directly below the electrolytic plating layer, and
   the through electrode and the wiring layer are stacked in contact with each other.

* * * * *